United States Patent [19]

Haeussler et al.

[11] Patent Number: 4,873,697

[45] Date of Patent: Oct. 10, 1989

[54] NARROWBAND LASER TRANSMITTER HAVING AN EXTERNAL RESONATOR FROM WHICH THE OUTPUT POWER CAN BE TAKEN

[75] Inventors: Klaus M. Haeussler, Munich; Julius Wittmann, Oberhaching; Gisela Gaukel, Munich; Franz Auracher, Baierbrunn, all of Fed. Rep. of Germany

[73] Assignee: Siemens Aktiengesellschaft, Berlin and Munich, Fed. Rep. of Germany

[21] Appl. No.: 76,839

[22] Filed: Jul. 23, 1987

[30] Foreign Application Priority Data

Sep. 29, 1986 [DE] Fed. Rep. of Germany ....... 3632998

[51] Int. Cl.[4] .................................................. H01S 3/08

[52] U.S. Cl. .................................. 372/108; 350/96.18; 350/96.19

[58] Field of Search ........................ 372/6, 50, 92, 108, 372/43, 100-102; 350/96.18, 96.16, 96.19

[56] References Cited

U.S. PATENT DOCUMENTS

| | | | |
|---|---|---|---|
| 3,894,789 | 7/1975 | Kobayashi et al. | 350/96.18 |
| 3,937,560 | 2/1976 | Milton | 350/96.16 |
| 4,156,206 | 5/1979 | Comerford et al. | 372/108 |
| 4,418,980 | 12/1983 | Keil et al. | 350/96.18 |
| 4,636,030 | 1/1987 | Carter et al. | 350/96.18 |
| 4,677,630 | 6/1987 | Fujita et al. | 372/32 |

FOREIGN PATENT DOCUMENTS

| | | | |
|---|---|---|---|
| 0061692 | 4/1983 | Japan | 372/92 |

OTHER PUBLICATIONS

Kobayashi et al., "Microoptic Grating Multiplexers and Optical Isolators for Fiber-Optic Communications", *IEEE Journal of Quantum Electronics*, vol. OE-16, No. 1, Jan. 1980, pp. 11-22.

Barry, "Design and System Requirements Imposed by the Selection of GaAs/GaAlAs Single Mode Laser Diodes for Free Space Optical Communications", *IEEE Journal of Quantum Electronics*, vol. QE-20, No. 5, May 1984, pp. 478-491.

Wyatt et al, "10 kHz Linewidth 1-5 μm InGaAsP External Cavity Laser With 55 nm Tuning Range", *Electronics Letters*, vol. 19, No. 3, Feb. 3, 1983, pp. 110-112.

Henry, "Theory of the Linewidth of Semiconductor Lasers", *IEEE Journal of Quantum Electronics*, vol. QE-18, No. 2, Feb. 1982, pp. 259-264.

Wyatt, "Spectral Linewidth of External Cavity Semiconductor Lasers With Strong, Frequency-Selective Feedback", *Electronics Letters*, vol. 21, No. 15, Jul. 18,1985, pp. 658-659.

Matthews et al., "Packaged Frequency-Stable Tunable 20 kHz Linewidth 1.5 μm InGaAsP External Cavity Laser", *Electronics Letters*, vol. 21, No. 3, Jan. 31, 1985, pp. 113-115.

Spano et al., "Theory of Noise in Semiconductor Lasers in the Presence of Optical Feedback", *IEEE Journal of Quantum Electronics*, vol. QE-20, No. 4, Apr. 1984, pp. 350-357.

Patzak et al., "Semiconductor Laser Linewidth in Optical Feedback Configurations", *Electronics Letters*, vol. 19, No. 24, Nov. 24, 1983, pp. 1026-1027.

Fye, "Relationship Between Carrier-Induced Index Change and Feedback Noise in Diode Lasers", *IEEE Journal of Quantum Electronics*, vol. QE—18, No. 10, Oct. 1982, pp. 1675-1678.

Smith, "Stabilized, Single-Frequency Output from a Long Laser Cavity", *IEEE Journal of Quantum Electronics*, vol. QE—1, No. 8, Nov. 1965, pp. 343-348.

*Primary Examiner*—William L. Sikes
*Assistant Examiner*—B. R. Holloway
*Attorney, Agent, or Firm*—Hill, Van Santen, Steadman & Simpson

[57] ABSTRACT

A narrowband laser transmitter which has a semiconductor laser and an external optical resonator coupled to the semiconductor laser so that the output power of the transmitter can be taken from the resonator, characterized by the laser transmitter being both a micro-optical realization or implementation as well as executed with a free beam propagation. To this end, the resonator is composed of an optical grating arrangement arranged in the beam path of the laser emission from the semiconductor laser and this optical grating arrangement will conduct one part of the supplied laser emission back to the semiconductor laser while conducting the other or second part of the emission to a coupling location at which the other part can be taken as the output power of the transmitter.

16 Claims, 2 Drawing Sheets

ER PK GE LS SFO St KO TG St2 FO HL KS SyF A St1 SF SF2 L F EF PK2

ER
GE
LS
PK
SFO
TG
St
KO
St2
FO
KS
HL
SyF
F
A
St1
L
EF
SF
SF2
PK2

LS
ER
GE
KO
St
A
St1
TG
FO
KS
HL
SyF
F
SF1
St2
L
EF
PK1

SFO
PK
ER
GE
SF
KO
St
RG
HL
A
St1
ST
St2
LS
FO
EF
F
KS
SyF

LS
ER
SFO
PK
GE
SF1
KO
St
ST1
St2
FO
KS
HL
F
SyF
A
St1
St3
TG
PK2
EF
SF2
FO1
SF
EF1
F1
MOF

NARROWBAND LASER TRANSMITTER HAVING AN EXTERNAL RESONATOR FROM WHICH THE OUTPUT POWER CAN BE TAKEN

BACKGROUND OF THE INVENTION

The present invention is directed to a narrowband laser transmitter comprising a semiconductor laser and an external optical resonator coupled to the semiconductor laser with the outpower power of the transmitter being taken from the external optical resonator. This arrangement for the transmitter enables a wavelength selectivity for the transmitter.

A transmitter of a semiconductor laser and an external optical resonator is proposed in an earlier filed German patent application No. P 36 00 726.9, whose disclosure was incorporated in U.S. patent application Ser. No. 906,503, filed Sept. 12, 1986. In this proposed transmitter, the external optical resonator is fashioned in the form of an optical directional coupler, which is composed of two waveguides extending a slight distance from one another and with a defined coupling length so that crossover of power between the two waveguides will occur in the coupling length. One of the two waveguides is coupled to the semiconductor laser. The laser emissions coupled into these waveguides is supplied to a partially reflective feedback device which conducts a part of the laser emission back into the coupling length. That part of the laser emission that the feedback device allows to pass is conducted to another waveguide of a directional coupler by a loop-shaped optical waveguide. The output power of the transmitter is taken at this other waveguide.

An extremely narrowband, single-mode operating condition is required for future fiber-optic communication systems, particularly with a heterodyne or homodyne reception, can be achieved with such a laser transmitter.

Such a laser transmitter exhibits the advantage that the coupling of the resonator and of the system fiber to the semiconductor laser occurs at only one side of the semiconductor laser, in contrast to other embodiments of the laser transmitter wherein the system fiber is coupled at one side and the resonator is coupled to the semiconductor laser at the other side. As a result of the single-sided coupling, adjustment problems are considerably reduced and the requirement of a high mechanical stability of the fiber of the system and other external resonator can be easily met.

SUMMARY OF THE INVENTION

The object of the present invention is to provide a structure for a narrowband laser transmitter wherein both a micro-optical implementation or execution, as well as an execution with a free beam propagation of the laser transmitter, are possible.

This object is achieved by an improvement in a narrowband laser transmitter comprising a semiconductor laser and an external optical resonator coupled to the semiconductor laser with the output power of the transmitter being taken from the resonator. The improvements are that the resonator is composed of an optical grating means, which is arranged in the beam path of the laser emission of the semiconductor laser, for conducting a first part of the laser emission back to the semiconductor laser and conducting a second part of the emission to a coupling location at which the second part can be taken as the output power of the transmitter.

A single-mode laser operation with a narrow line width can be forced by the back reflection of the first part of the emitted laser emission. Preferable and advantageous development of the grating used in the laser transmitter of the invention are that the grating means comprises a partially reflective optical grating from which a narrowband first part of the laser emission is diffracted and reflected back in the direction towards the semiconductor laser and the second part is transmitted or conducted in a direction toward said coupling location. The reflective optical grating is preferably fashioned on one side face of a prismatic member of a material which is transparent for the laser emission and the grating is preferably a phase grating.

The grating means comprises a reflective grating from which the narrowband first part is diffracted back in the direction towards the semiconductor laser and works in conjunction with a beam splitter which is arranged in the beam path of the emitted laser emission with the beam splitter splitting a part of the emission out of the beam and deflecting this part in the direction towards the coupling location as the second part. The reflective grating is fashioned on one side of a prismatic member, which is composed of material that is transparent for the laser emission and is arranged in the beam path of the laser emission and the beam splitter is mounted to this prismatic member.

In another embodiment of the invention it is particularly important that a collimated optics for collimating the laser emission be arranged in the beam path of the emitted laser radiation between the semiconductor laser and the grating means. This collimating optic simultaneously focuses a narrowband part of the first part of the laser emission conducted back to the semiconductor laser onto the semiconductor laser. The collimated laser emission generated by the collimating optics optimizes the wavelength-selective effect of the grating means. As a result of the combination of the grating means with the collimating optics, only a narrow wavelength region is conducted back to and focused on the semiconductor laser. This is particularly the case when the collimating optics is composed of a graded index or gradient lens (see in this regard IEEE J. Quant. Electronics QE-16 (1980) pp. 11–22). The embodiment with the gradient lens, particularly in its development in accordance with it being fixed to a prismatic member is suited for micro-optical execution of the laser transmitter of the present invention.

Another embodiment of the laser transmitter of the invention has a free beam propogation, preferably comprising collimating optics being composed of a microscopic objective arranged in the free beam path of the laser emission between a semiconductor laser and the grating means.

Expediently, a focusing optics is arranged in the beam path of said second part of the laser emission that is conducted to the coupling location. The focusing optics are arranged for focusing this second part onto the coupling location. This focusing optics is preferably composed of a gradient lens and is especially used for the micro-optical execution, but also can be used for the execution having a free beam propogation.

It is especially advantageous to design the gradient lens, which is arranged in the beam path of the second part of the laser emission and is connected to the coupling location, in such a fashion so that the focus of the second part coincides with an end face of the gradient lens. As a result thereof, a system fiber for forwarding the output power of the laser transmitter can be directly butt-coupled to the gradient lens.

It is expedient in view of the micro-optical execution of the laser transmitter to construct the transmitter in accordance with the use of a gradient lens which may be of a length so that the focal point of the lens is on an end surface of the lens as a focussing optic which is fixed to the prismatic member of material which is transparent to the laser emission. The prismatic member is arranged in the beam path of the second part of the laser emission that is to be conducted to the coupling location.

When an additional monitoring output is required, for example for control purposes, then an additional beam splitter can be provided in one of the beam paths of the laser of the invention. This additional beam splitter cuts or splits a third part of the radiation out for monitoring purposes so that this additional beam splitter is preferably arranged in the beam path of the emitted laser emission in accordance with an arrangement wherein it is between the semiconductor laser and the grating means.

When utilizing the additional beam splitter, other advantages are that it is arranged in the beam path to cut out a third part for monitoring purposes and that it is arranged between the collimating optics and the grating means and is fixed to the prismatic member which is positioned in the beam path of the emitted laser radiation. Focussing optics for this third part of the laser emission, which is to be cut out for monitoring purposes, is a gradient lens, which has its surface fixed to the prismatic member and whose length is dimensioned so that the focus of this third part coincides with the end face of the gradient lens.

A wavelength balancing or tuning in a laser transmitter of the invention is possible with a lateral displacement of the overall resonator relative to the semiconductor laser. A fine balancing or tuning is possible by adaptation of the resonator length, for example, the optical distance between the semiconductor laser and the grating arrangement. For example, given a wavelength of 1.3 pm and an optical path of 15 mm in the external resonator, the frequency modification is 15 GHz/pm.

Since the line width of the resulting single mode spectrum is inversely proportional to the length of the external resonator (see *IEEE J. of Quant. Electronics*, QE-20 (1984) pp. 486ff.), a gradient lens arranged in front of the grating arrangement can be lengthened by a multiple of what is referred to as its "pitch" length in order to achieve smaller line widths. This will not influence the beam quality, nor the stability of the arrangement.

The micro-optical embodiment of the laser transmitter emission can be constructed in an extremely compact fashion.

Other advantages and features will be readily apparent from the following description of the drawings, claims and disclosure.

DESCRIPTION OF THE PREFERRED EMBODIMENTS

The principles of the present invention are particularly useful in a laser transmitter generally indicated at LS in the FIGS. and includes a semiconductor laser HL and an external optical resonator ER.

Figure 1:
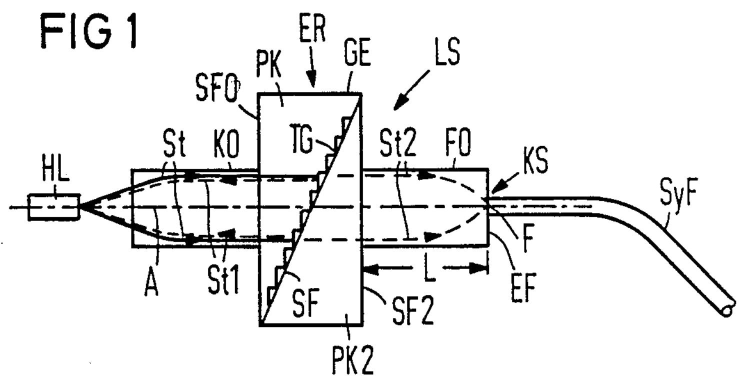
FIG. 1 is a side view of a micro-optical embodiment of the laser transmitter comprising a partially reflecting grating between two prisms and comprising two gradient lenses in accordance with the present invention.

The laser transmitter LS of FIG. 1 includes the semiconductor laser HL, which has a beam path St of divergent emission extending on an axis A. A collimated or first gradient lens KO is arranged in the beam path St and collimates the divergent radiation into an essentially parallel radiation. The gradient lens KO, at an end surface, is fixed to a side face or surface SFO of a transparent prism PK. The side face SFO faces the semiconductor laser HL and is arranged to extend perpendicular to the axis A of the beam path. A partially reflecting optical grating TG in the form, for example, of a phase grating having, for example, a saw tooth profile is fashioned on a side surface or face SF of the prism PK which faces away from the semiconductor laser HL and is arranged to extend obliquely at an angle relative to the axis A. A second transparent prism PK2, which augments the prism PK to form a transparent cuboid is arranged on the surface SF of the prism PK. The grating TG could also be formed in the second prism PK2. These two prisms PK and PK2 and the grating TG form the grating means GE and are part of the resonator ER.

A focusing or second gradient lens OF has one of its end faces fixed or mounted at a side SF2 of the second prism PK2 that faces away from the semiconductor laser HL. This second or focusing gradient lens OF focuses a second part St2 of the laser emission that has passed through the grating TG and the second prism PK2 onto a coupling location KS. The length L of this second gradient lens OF is selected so that a focus point F of the focused second part St2 of the laser emission coincides with the end face EF of the second gradient lens OF that faces away from the semiconductor laser HL.

This has the advantage that a system fiber SyF, which is to be coupled to the coupling location KS and which forwards the output power of the transmitter LS, can be directly butt-coupled to the gradient lens OF, as shown in FIG. 1 at the point F on the surface EF.

The grating arrangement GE is formed of the double prism arrangement and guarantees a simple beam path and, thus, a good coupling efficiency into the fiber SyF of the system.

The grating TG also conducts a narrowband part ST1 of a laser emission output by the semiconductor laser HL back to the semiconductor laser HL. The wavelength-selective effect of the grating TG is optimized by the firmly connected collimating or first gradient lens KO, since this lens KO generates a collimated beam St given a suitable distance from the semiconductor laser HL. Due to the combination of the first gradient lens KO and of the grating arrangement GE, only a narrow wavelength region is reflected back into itself and is re-focused onto the semiconductor laser HL.

As a result of the structural elements employed, the arrangement of FIG. 1 is constructed in an extremely compact fashion.

Figure 2:
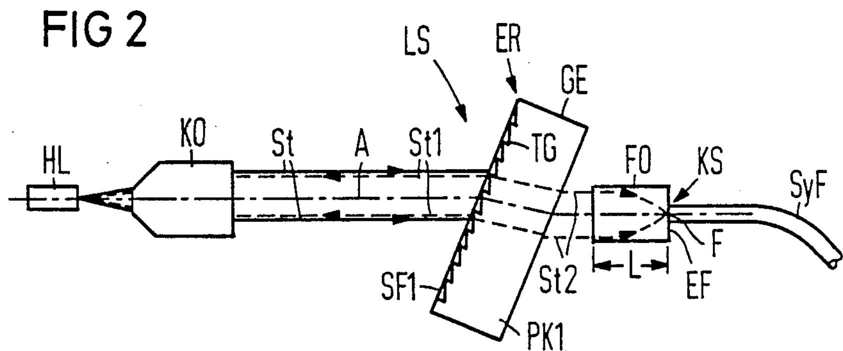
FIG. 2 is a side view of an embodiment of the laser transmitter comprising a free beam propagation.

In FIG. 2, the embodiment of the laser transmitter LS has a free beam propagation to the grating means GE and also therefrom. As illustrated, the grating TG of the grating means GE is a partially reflective grating. The collimating optics KO in the embodiment of FIG. 2 is composed of a microscope objective arranged in the beam path St of the laser emission, which is divergently emitted from a semiconductor laser HL. The microscope objective converts the divergent laser emission into parallel beams that propagate freely following the objective. The grating means GE is arranged in this beam path St of the laser emission. This grating means GE is composed of a cuboid, which is a transparent member PK1 that is arranged at an angle obliquely relative to the axis A of the beam path and has a partially reflecting grating TG which, for example, is fashioned here on the side face SF1 of the member PK1, which face SF1 faces the semiconductor laser HL. The grating is fashioned, for example, in the form of a phase grating.

That part of the laser emission conducted back to the semiconductor laser HL by the grating TG is focused onto the semiconductor laser HL by the microscope objective KO. That part St2, which is the second part of the laser emission that has passed through the grating TG and the cuboid member PK1, is focused onto a coupling location KS by a focusing optics OF. This focusing optics OF can also blank out a part of the supplied radiation. It can be integrated in the grating means GE and, as in the embodiment of FIG. 1, can be a second gradient lens, whose length is appropriately selected so that the focal point F of the second part St2 focused by the second lens coincides with an end face EF facing away from the semiconductor laser HL.

In the embodiment of FIG. 2, the maximum amount of power that can be coupled out is dependent on the quality of the coupling via the microscope objective, as well as on the reflecting property of the grating TG. Changes in the resonator length and in the degree of feedback are easily possible in this embodiment.

Let it be pointed out that the free beam propagation with feedback is practiced by a grating in Littrow configuration in many known arrangements in order to achieve narrow line widths and single-mode behavior. Examples of this are shown in *Electron. Lett.* 19 (1983) pp. 110–112; *IEEEJ. Quant. Electr.* QE-18 (1982) pp. 259 ff., and *Electron. Lett.* 21 (1985) pp. 658–659. All of these arrangements use the two-sided coupling to the semiconductor laser wherein the output power of the transmitter is taken at one side of the semiconductor laser and the external resonator is coupled to the other side of the semiconductor laser.

Figure 3:
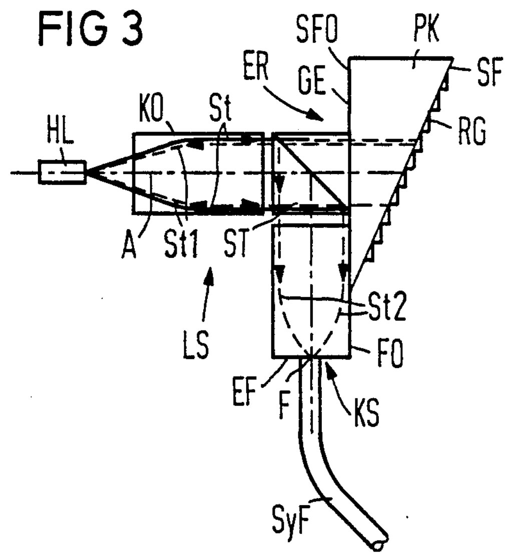
FIG. 3 is a side view of a micro-optical embodiment of the laser transmitter comprising a reflecting grating, a beam splitter and two gradient lenses.

In the micro-optical embodiment of the laser transmitter of FIG. 3, the essential differences from the embodiments of FIG. 1 is that the grating of the grating means GE is a reflecting grating RG that should have the highest possible reflectivity. As in the embodiment of FIG. 1, the divergent laser emission is collimated by a first gradient lens KO and the grating means GE is composed of transparent prism PK on whose surface SF, which faces away from the semiconductor laser HL has the reflecting grating RG applied, for example, in the form of a relief-like grating having a sawtooth profile.

A beam splitter ST is required for coupling out the output power of the laser transmitter LS. This beam splitter ST is expediently arranged between the first gradient lens KO and the prism PK in the beam path St of the laser emission and deflects the second part St2 of the laser emission out of the beam path at an angle of approximately 90°relative to the axis A. The beam splitter ST is expediently fixed or mounted to the prism PK, for example on a surface SFo which faces toward the semiconductor laser HL and can be composed of a beam splitter cube.

The second part St2 of the laser emission deflected or split out is focused onto a coupling location KS by a focusing optics OF. The focusing optics is likewise expediently secured to the prism PK. As in the embodiment of FIGS. 1 and 2, it can be composed of a second gradient lens of a corresponding length, wherein the focal point F of the focused second part St2 of the laser emission which has been deflected out coincides with the end face EF facing away from the beam splitter ST. The fixing of the gradient lens expediently occurs so that one end face of the lens is fixed to the side face SFo of the prism PK facing toward the semiconductor laser HL.

The beam splitter ST also deflects a part of the first part St1 of the laser emission that is conducted back to the semiconductor laser HL and this reflected first part is not shown or exploited in FIG. 3. The embodiment of the laser transmitter LS of FIG. 3 is also constructed in a very compact form In yet another embodiment of the laser transmitter LS of FIG. 4 differs from the embodiment of FIG. 1 only in that an additional beam splitter St1 is arranged between the collimation optics KO and the grating means GE in the beam path St of the laser emission. This additional beam splitter St1 reflects out a third part St3 of the laser emission for monitoring purposes, and this third part is focused by a focusing optics F01, which is arranged in the beam path of the third part St3. Like the beam splitter ST in the embodiment of FIG. 3, the additional beam splitter ST1 can be fixed to the prism PK and can be a beam splitter cube. Like the focusing optics OF of the embodiment of FIG. 3, the focusing optics FO1 can also be fixed to the prism PK and can be a third gradient lens wherein the focal point F1 of the focused split-out third part St3 of the laser emission coincides with an end face EF1 facing away from the additional beam splitter ST1. As a result thereof, a monitor fiber MoF can be directly butt-coupled to the end face EF1 of the focusing optics FO1.

Figure 4:
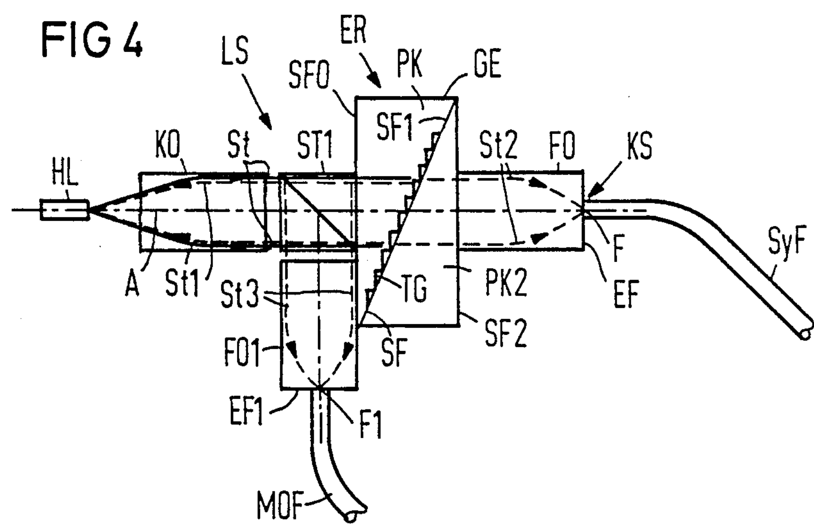
FIG. 4 is a side view of a micro-optical embodiment of the laser transmitter on the basis of the embodiment of FIG. 1 having an additional beam splitter and a focusing optics of the part of the laser emission which is to be split out for monitoring purposes.

The embodiment of FIG. 4 is also distinguished by a very compact structure. The arrangement for monitoring purposes, as shown by way of example in FIG. 4, can be provided in every embodiment of the laser transmitter.

Let it again be pointed out in conclusion that the special advantage of the laser transmitter described herein lies in the turnability or matchability of the emission spectrum on the basis of the grating and of the resonator length. It is expedient to provide mirrors on the sides of the semiconductor laser HL facing away from the external resonator ER. As a result thereof, the optical power given the same pump system is increased due to the lowering of the threshold current and the sensitivity with respect to parasitic reflections is reduced. This is true of all laser transmitters comprising external resonators and a single-sided out coupling, for example, in which the output power of the transmitter is taken at the side of the resonator.

Although various minor modifications may be suggested by those versed in the art be understood that we wish to embody within the scope of the patent granted hereon all such modifications as reasonably and properly come within the scope of our contribution to the art.

We claim:

1. In a narrowband laser transmitter comprising a semiconductor laser having a laser emission output and an external optical resonator being coupled to the semiconductor laser wherein an output power of the transmitter can be taken from the resonator, the improvements comprising said resonator being composed of an optical means being arranged in the beam path of the laser emission output of the semiconductor laser for conducting a first part of the laser emission output back to the semiconductor laser and directing a second part of the laser emission output along a separate beam path having a beam axis, and a focussing optic composed of a gradient lens having a length along a lens axis being selected with a focus point of the lens coinciding with an end face of said gradient lens, said gradient lens being disposed in said beam path with the lens axis coinciding with the beam axis, said focus point on said end face forming a coupling location at which said second part can be taken as the output power of said transmitter, said optical means including grating means.

2. In a narrowband laser transmitter according to claim 1, wherein said grating means comprises a partially reflecting optical grating from which the first part of the laser emission output is diffracted back in the direction towards the semiconductor laser as a narrowband part and the second part of the laser emission output is emitted in the direction toward said coupling location.

3. In a narrowband laser transmitter according to claim 2, wherein said partially reflecting optical grating is provided on a side surface of a prismatic member of material that is transparent to the laser emission.

4. In a narrowband laser transmitter according to claim 3, wherein said partially reflecting optical grating is a phase grating.

5. In a narrowband laser transmitter according to claim 1, wherein said grating means comprises a reflecting grating by which the first part is diffracted back in the direction toward the semiconductor laser as a narrowband part, said optical means further including a beam splitter being arranged in the beam path of the laser emission output, said beam splitter splitting out a part of the laser emission output and deflecting this split-out part in a direction toward said coupling location as said second part.

6. In a narrowband laser transmitter according to claim 5, wherein said reflecting grating is provided on one surface of a prismatic member.

7. In a narrowband laser transmitter according to claim 6, wherein said prismatic member is composed of material that is transparent to the laser emission output and is arranged in the beam path of the laser emission output.

8. In a narrowband laser transmitter according to claim 7, wherein said beam splitter is affixed to said prismatic member.

9. In a narrowband laser transmitter according to claim 1, which includes collimating optics being arranged in the beam path of the laser emission output between the semiconductor laser and the grating means, said collimating optics simultaneously focusing the first part of the laser emission output which is conducted back by the grating means onto the semiconductor laser.

10. In a narrowband laser transmitter according to claim 9, wherein the collimating optics is composed of a second gradient lens.

11. In a narrowband laser transmitter according to claim 10, wherein the grating means includes a prism with a first surface facing the semiconductor laser and a second surface facing away from the semiconductor laser, said grating means further including a partially reflecting optical grating on said second surface, said second gradient lens being secured to said first surface of the prismatic member.

12. In a narrowband laser transmitter according to claim 9, wherein the collimating optics is composed of a microscope objective arranged in a free beam path of the laser emission output between a semiconductor laser and the grating means.

13. In a narrowband laser transmitter according to claim 11, wherein the grating means includes a prismatic member having a surface facing away from the semiconductor laser, said gradient lens of the focusing optics being secured to said surface.

14. In a narrowband laser transmitter according to claim 13, which includes a beam splitter being arranged in the beam path of the laser emission output between the semiconductor laser and the grating means, said beam splitter splitting out a part of the laser emission output as a third part for monitoring purposes.

15. In a narrowband laser transmitter according to claim 14, wherein second focusing optics are arranged in a beam path of the third part of the laser emission output split by the beam splitter

16. In a transmitter according to claim 15, which includes collimating optics arranged between the beam splitter and the semiconductor laser so that the beam splitter is positioned between the collimating optics and said grating means, said grating means being a prismatic member arranged in a beam path of said laser emission output, said second focussing optic being a second gradient lens and being secured with the beam splitter on the prismatic member, said second gradient lens having a length dimension so that the focus of the third part of radiation coincides with an end face of said second gradient lens.

* * * * *